United States Patent
Wu et al.

(10) Patent No.: US 10,895,680 B2
(45) Date of Patent: Jan. 19, 2021

(54) DISPLAY DEVICE AND MANUFACTURING METHOD THEREOF

(71) Applicant: E Ink Holdings Inc., Hsinchu (TW)

(72) Inventors: Chi-Ming Wu, Hsinchu (TW);
Yi-Ching Wang, Hsinchu (TW);
Tsung-Chin Lin, Hsinchu (TW);
Ching-Huan Liao, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 94 days.

(21) Appl. No.: 16/052,591

(22) Filed: Aug. 1, 2018

(65) Prior Publication Data
US 2019/0227223 A1 Jul. 25, 2019

(30) Foreign Application Priority Data
Jan. 25, 2018 (CN) .......................... 2018 1 0071300

(51) Int. Cl.
*G02F 1/1333* (2006.01)
*F21V 8/00* (2006.01)
*H01L 23/544* (2006.01)

(52) U.S. Cl.
CPC ......... *G02B 6/0086* (2013.01); *G02B 6/0088* (2013.01); *G02F 1/1333* (2013.01); *H01L 23/544* (2013.01); *G02F 2001/133354* (2013.01); *H01L 2223/54426* (2013.01)

(58) Field of Classification Search
CPC ......... G02F 2001/13354; G02F 1/1333; G02F 1/133308; H01L 23/544; H01L 2223/54426; G02B 6/0086; G02B 6/0088
See application file for complete search history.

(56) References Cited

U.S. PATENT DOCUMENTS

| | | | |
|---|---|---|---|
| 8,558,977 B2 | 10/2013 | Gettemy et al. | |
| 8,952,920 B2 | 2/2015 | Kuo et al. | |
| 9,103,512 B2 | 8/2015 | Franklin et al. | |
| 2014/0104512 A1 | 4/2014 | Huang et al. | |
| 2015/0201498 A1 | 7/2015 | Lin et al. | |
| 2015/0277227 A1 | 10/2015 | Guo | |
| 2016/0062185 A1* | 3/2016 | Cheng | G02F 1/133608 349/12 |
| 2016/0197293 A1 | 7/2016 | Chen et al. | |
| 2017/0153486 A1* | 6/2017 | Ahn | B60K 37/02 |
| 2017/0168344 A1* | 6/2017 | Song | G02F 1/133308 |

FOREIGN PATENT DOCUMENTS

| | | |
|---|---|---|
| CN | 202522816 U | 11/2012 |
| CN | 105700214 A | 6/2016 |
| TW | 201728976 A | 8/2017 |

OTHER PUBLICATIONS

Corresponding Taiwan office action dated Dec. 7, 2018.

* cited by examiner

*Primary Examiner* — Thanh Nhan P Nguyen
(74) *Attorney, Agent, or Firm* — CKC & Partners Co., LLC

(57) ABSTRACT

A display device includes a display module and an optical film. The display module has a through hole. At least one optical film is located on the display module and has an alignment through hole aligned with the through hole and an alignment mark surrounding the alignment through hole.

15 Claims, 12 Drawing Sheets

DISPLAY DEVICE AND MANUFACTURING METHOD THEREOF

CROSS-REFERENCE TO RELATED APPLICATION

This application claims priority to China Application Serial Number 201810071300.7, filed Jan. 25, 2018, which is herein incorporated by reference in its entirety.

BACKGROUND

Field of Invention

The present invention relates to a display technique field. More particularly, the present invention relates to a display device and a manufacturing method thereof.

Description of Related Art

During the process of manufacturing a display device, it is usual to dispose an optical film on a display module. The attachment operation between the optical film and the display module is performed by using the relative distance between the reference edge of the display module and the reference edge of the optical film as a reference standard.

However, as the attachment operation is performed, both of the display module and the optical film having through holes, the different shape may directly influence the alignment accuracy between the through hole of the display module and that of the optical film. More specifically, the above attachment operation easily causes that the center of the through hole of the display module cannot align with the center of the through hole of the optical film. These problems may become worse when the display module has non-square shape.

In view of the above, it is necessary to develop a new display device and a manufacturing method thereof.

SUMMARY

The present disclosure provides a display device including a display module and a first optical film. The display module has a through hole. The first optical film is located on the display module and has a first alignment through hole aligned with the through hole and a first alignment mark surrounding the first alignment through hole.

In some embodiments, the display device further includes a light source disposed next to a side of the first optical film, wherein the first optical film is a light guide plate.

In some embodiments, the display device further includes a second optical film on the first optical film. The second optical film has a second alignment through hole aligned with the first alignment through hole and a second alignment mark surrounding the second alignment through hole. The first alignment mark is aligned with the second alignment mark.

In some embodiments, the first optical film is a light guide plate, and the second optical film is an anti-glare layer or a touch sensing layer.

In some embodiments, the display device further includes a third optical film on the second optical film. The third optical film has a third alignment through hole aligned with the second alignment through hole and a third alignment mark surrounding the third alignment through hole. The second alignment mark is aligned with the third alignment mark. The first optical film is a light guide plate. The second optical film is a touch sensing layer. The third optical film is an anti-glare layer.

In some embodiments, the display module includes a visual region and a non-visual region. The visual region surrounds the non-visual region. The through hole is in the non-visual region.

In some embodiments, the display module further includes a light emitting display layer.

The present disclosure provides a manufacturing method of a display device. The manufacturing method includes the following operations: providing a display module which has a through hole thereon; marking an auxiliary alignment mark around the through hole; disposing a first optical film on the display module, wherein the first optical film has a first alignment through hole and a first alignment mark surrounding the first alignment through hole; and aligning the first alignment mark with the auxiliary alignment mark to make the first alignment through hole align with the through hole.

In some embodiments, the manufacturing method further includes disposing a second optical film on the first optical film, wherein the second optical film has a second alignment through hole and a second alignment mark surrounding the second alignment through hole; and aligning the second alignment mark with the first alignment mark to make the second alignment through hole align with the first alignment through hole.

In some embodiments, the manufacturing method further includes disposing a third optical film on the second optical film, wherein the third optical film has a third alignment through hole and a third alignment mark surrounding the third alignment through hole; and aligning the third alignment mark with the second alignment mark to make the third alignment through hole align with the second alignment through hole.

In some embodiments, the manufacturing method further includes disposing a light source next to a side of the first optical film.

In some embodiments, the through hole is formed by a laser cutting.

In some embodiments, the manufacturing method further includes removing the auxiliary alignment mark.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
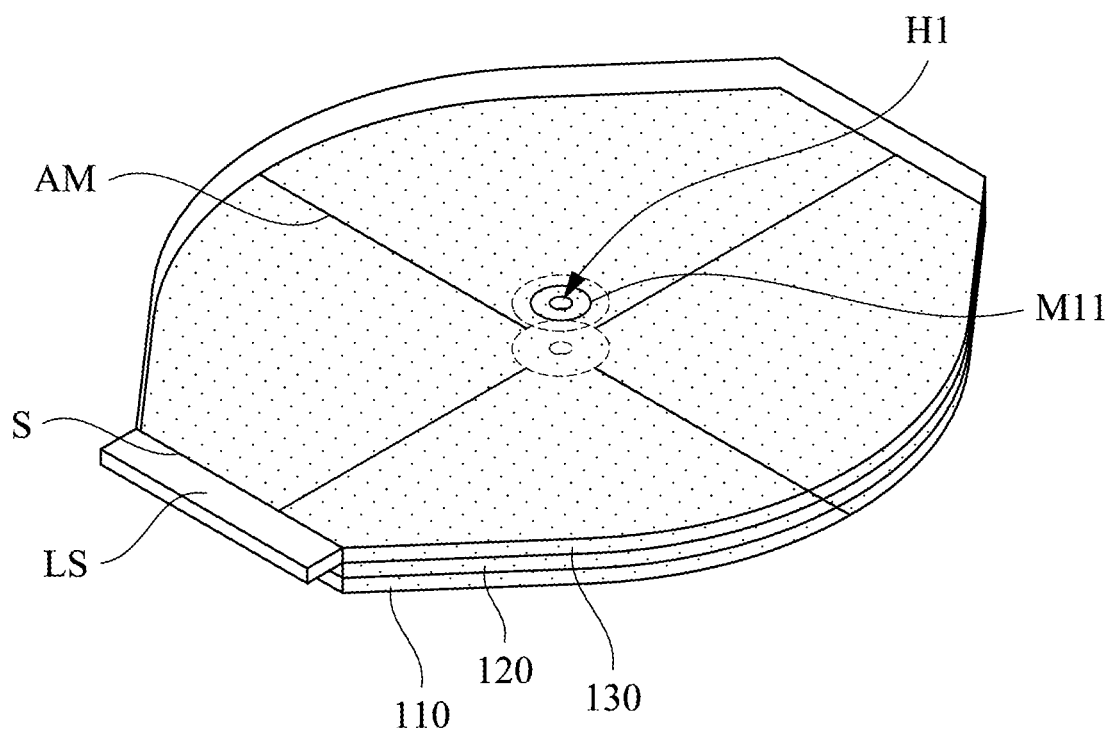
FIGS. 1A, 2A, 3A, and 4A respectively show three dimensional views of display devices according to some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the drawings, some of the conventional structures and elements are shown with schematic illustrations.

FIG. 1A shows a three dimensional view of a display device 100 according to some embodiments of the present disclosure. As shown in FIG. 1A, the display device 100 includes a display module 110, a first adhesive layer 120, an optical film such as a light guide plate 130, and a light source LS. The light guide plate 130 is located on the display module 110. The first adhesive layer 120 is located between the light guide plate 130 and the display module 110 to adhere the display module 110 to the light guide plate 130. The light source LS is disposed next to a side S of the light guide plate 130. In the display device of the embodiment, the disposition of the light source is front light type. However, the disposition of the light source in the display device of the present disclosure may be direct-type or backlight-type; namely the light source is located under the light guide plate, or the light guide plate is located under the display module. The light source LS may be light emitting diode (LED).

Figure 1B:
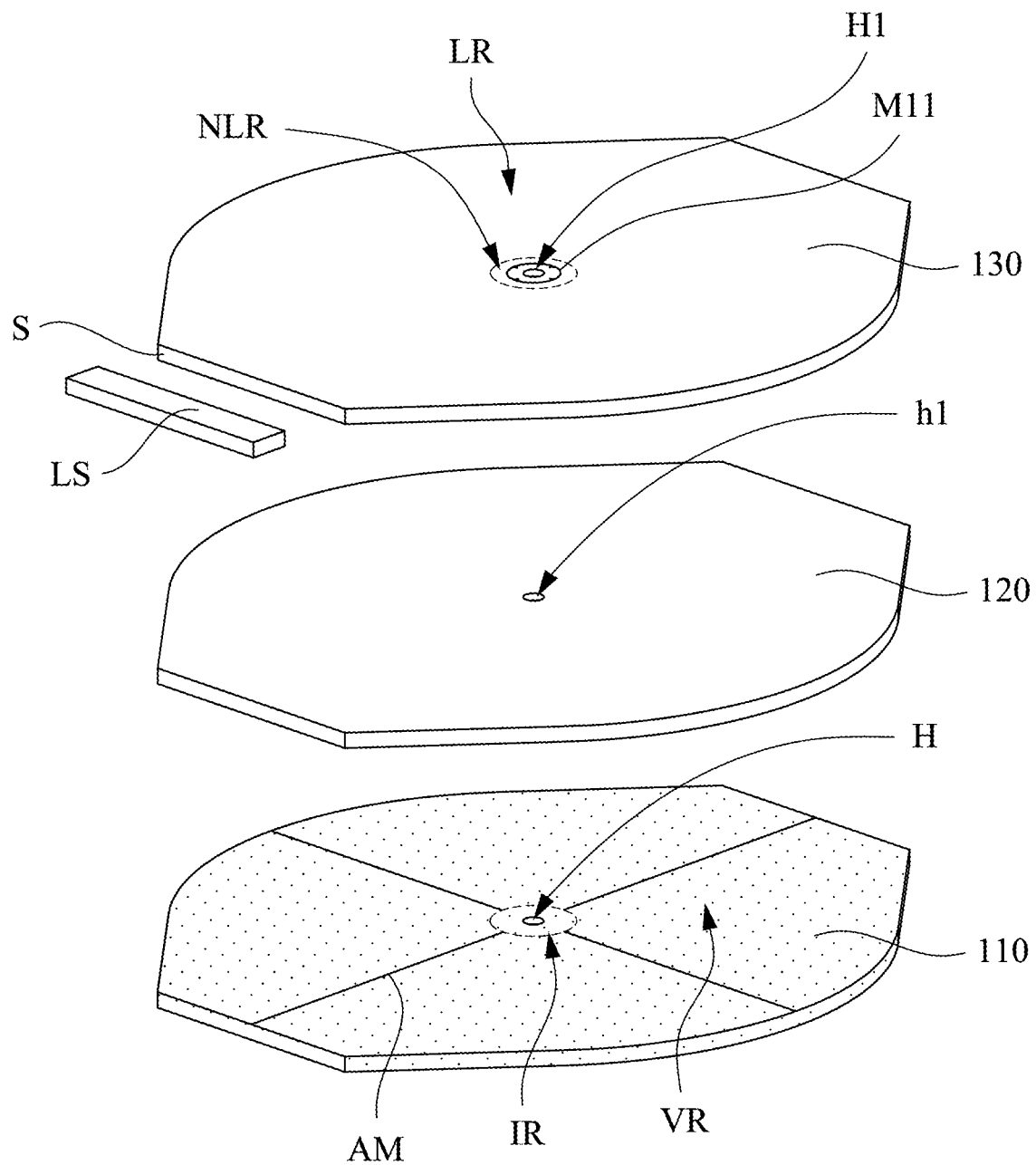
FIGS. 1B, 2B, 3B, and 4B respectively show exploded views of display devices according to some embodiments of the present disclosure.

FIG. 1B shows an exploded view of the display device 100 shown in FIG. 1A. As shown in FIG. 1B, the display module 110 has a through hole H, and includes a visual region VR and a non-visual region IR. The visual region VR surrounds the non-visual region IR. The through hole H is located in the non-visual region IR. In some embodiments, the display module 110 is a reflective display module such as an electronic paper display module. The display module 110 may be a light-emitting module such as an organic LED. When the display module is a reflective display module, the light source LS can be omitted. The display module 110 may be a non-reflective display module such as a liquid crystal display (LCD). When the display module is a non-reflective display module, the light guide plate may be located under the display module.

The light guide plate 130 has a first alignment through hole H1 and a first alignment mark M11 surrounding the first alignment through hole H1. In some embodiments, the light guide plate 130 includes a light guide dot region LR and a non-light guide dot region NLR. The light guide dot region LR surrounds the non-light guide dot region NLR. The first alignment through hole H1 is located in the non-light guide dot region NLR. In some embodiments, the first alignment mark M11 is an ink pattern. For example, when the light guide dots on the light guide plate 130 are formed by silk screen printing, the first alignment mark M11 can be formed simultaneously by the silk screen printing. In another embodiment, the first alignment mark M11 is an etching pattern. For example, when the light guide dots on the light guide plate 130 are formed by etching, the first alignment mark M11 can be formed simultaneously by the etching. As shown in FIG. 1B, the first alignment mark M11 is a ring mark having four arrowheads pointing to the first alignment through hole H1. But the shape of the first alignment mark M11 is not limited thereto. In another embodiment, the first alignment mark M11 is a mark having four arrowheads pointing to the first alignment through hole H1.

The manufacturing method of the above display device 100 may include the following operations. A display module 110 with a through hole H1 is provided. In some embodiments, the through hole H is formed by a laser cutting. An auxiliary alignment mark AM is shown around the through hole H. The light guide plate 130 is disposed on the display module 110. The light guide plate 130 has the first alignment through hole H1 and the first alignment mark M11 surrounding the first alignment through hole H1. The first alignment mark M11 is aligned with the auxiliary alignment mark AM to make the first alignment through hole H1 align with the through hole H of the display module 110. In some embodiments, the manufacturing method further includes disposing the light source LS next to the side S of the light guide plate 130. In some embodiments, the manufacturing method further includes adhering the display module 110 to the light guide plate 130 by the first adhesive layer 120, wherein the first adhesive layer 120 has a through hole h1 aligned with the first alignment through hole H1 and the through hole H. Further, after accomplishing the above alignments, the auxiliary alignment mark AM can be removed. Therefore, in some embodiments, the display device 100 does not show the auxiliary alignment mark AM. As shown in FIG. 1B, the auxiliary alignment mark AM is four straight marks extending from four edges of the display module 110. But the shape of the auxiliary alignment mark AM is not limited thereto.

Figure 1C:
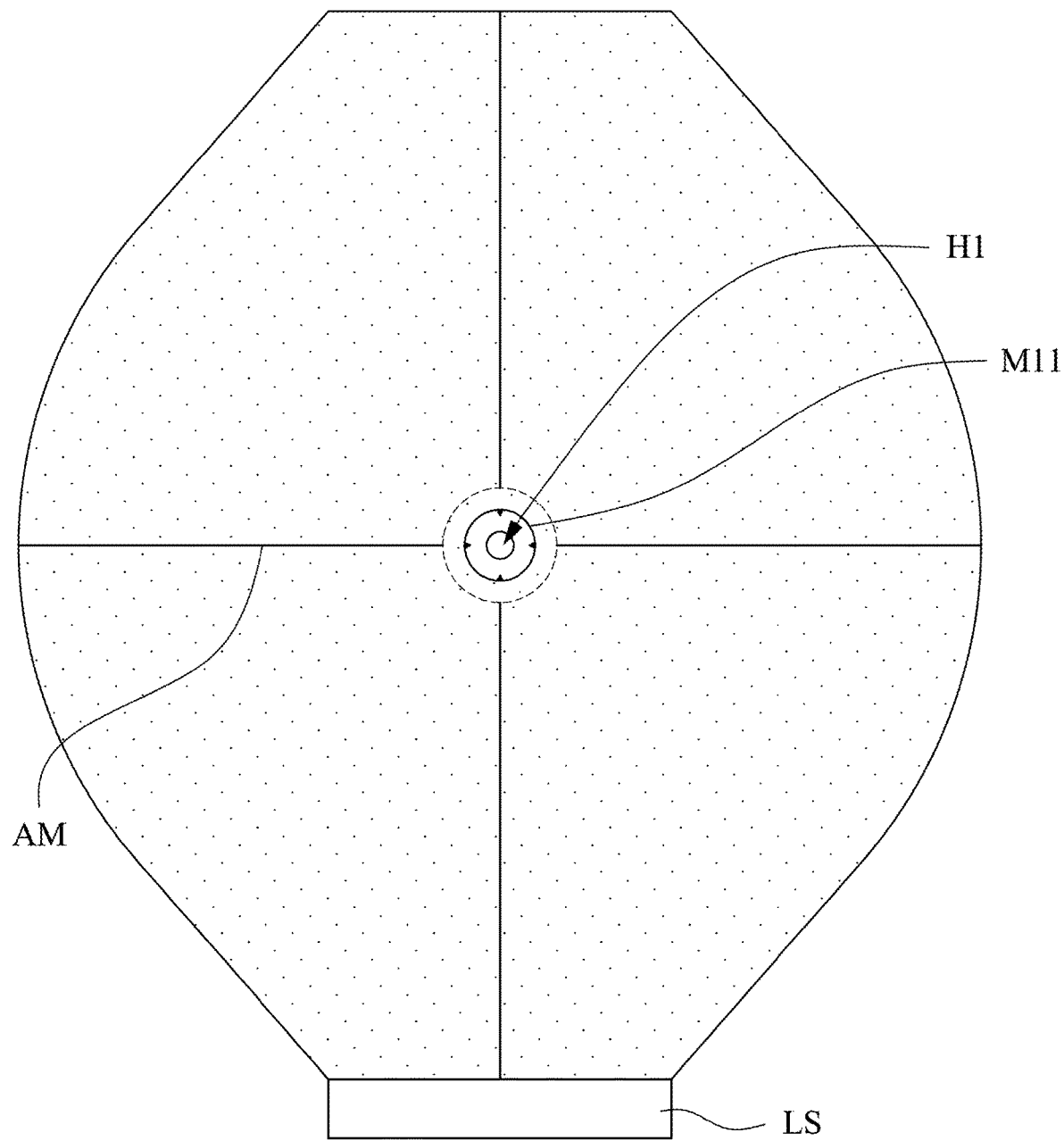
FIGS. 1C, 2C, 3C, and 4C respectively show top views of display devices according to some embodiments of the present disclosure.

FIG. 1C shows a top view of the display device 100 shown in FIG. 1A. Please refer to FIGS. 1B and 1C simultaneously. By aligning the first alignment mark M11 with the auxiliary alignment mark AM, namely aligning the arrowheads of the first alignment mark M11 with each of the straight marks of the auxiliary alignment mark AM, the first alignment through hole H1 of the light guide plate 130 can be aligned with the through H of the display module 110. Moreover, the above alignment operations can enhance the alignment accuracy of the first alignment through hole H1 of the light guide plate 130 and the through H of the display module 110.

Figure 2A:
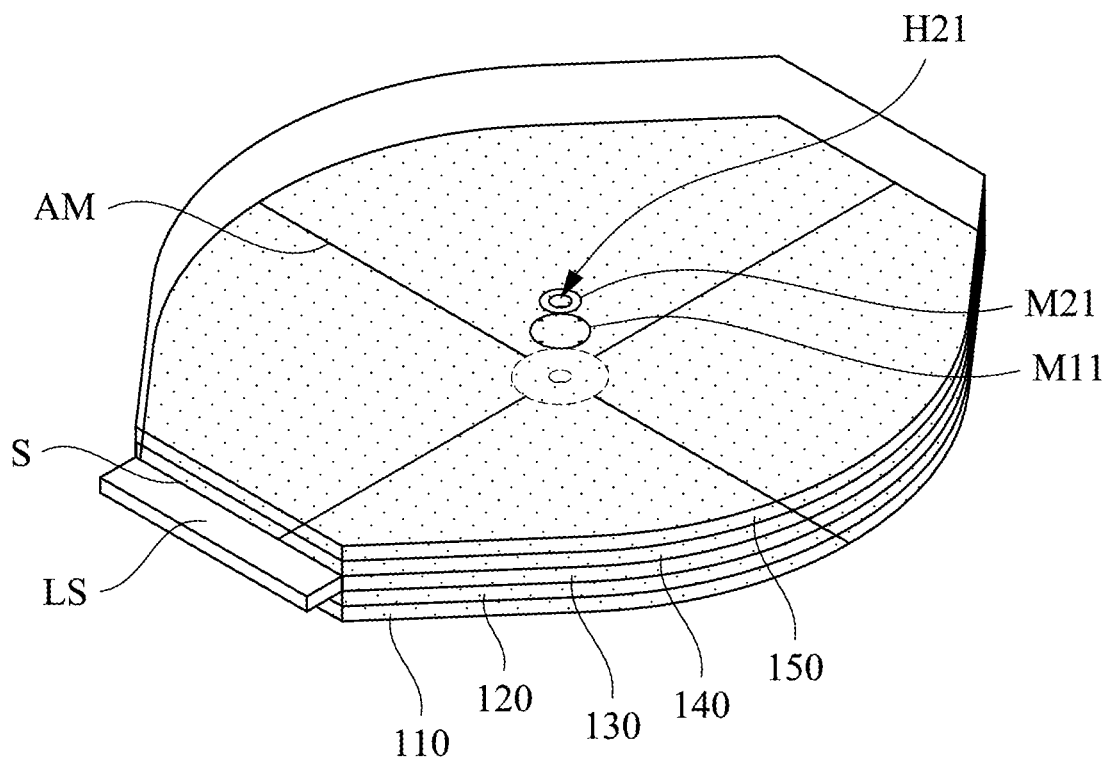

FIG. 2A shows a three dimensional view of a display device 200 according to some embodiments of the present disclosure. As shown in FIG. 2A, the display device 200 includes the display module 110, the first adhesive layer 120, a first optical film such as the light guide plate 130, the light source LS, a second adhesive layer 140, and a second optical film such as an anti-glare layer 150. The anti-glare layer 150 is located on the light guide plate 130. The second adhesive layer 140 is located between the anti-glare layer 150 and the light guide plate 130 to adhere the anti-glare layer 150 to the light guide plate 130. The difference between the display device 200 and the display device 100 is that the display device 200 further includes the second adhesive layer 140 and the anti-glare layer 150.

Figure 2B:
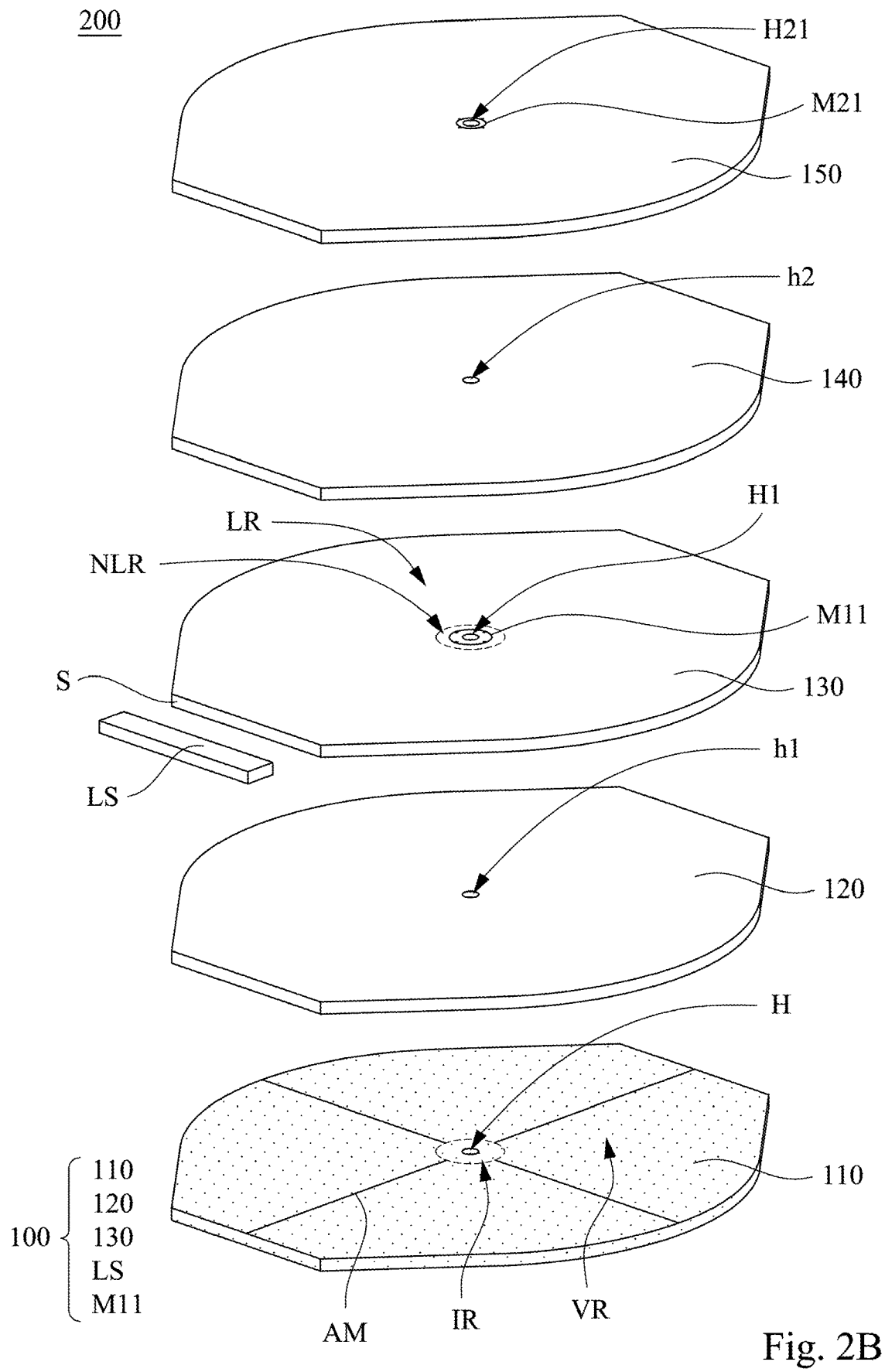

FIG. 2B shows an exploded view of the display device 200 shown in FIG. 2A. As shown in FIG. 2B, the anti-glare layer 150 has a second alignment through hole H21 and a second alignment mark M21 surrounding the second alignment through hole H21, wherein the second alignment through hole H21 of the anti-glare layer 150 is aligned with the first alignment through hole H1 of the light guide plate 130.

In some embodiments, the second alignment mark M21 is an ink pattern or an etching pattern. As shown in FIG. 2B, the second alignment mark M21 is a ring mark having four arrowheads pointing away from the second alignment through hole H21, but the shape of the second alignment through hole H21 is not limited thereto. In another embodiment, the second alignment mark M21 is a mark having four arrowheads pointing away from the second alignment through hole H21.

The manufacturing method of the above display device 200 may include the following operations. The display device 100 is received. The anti-glare layer 150 is disposed on the light guide plate 130, wherein the anti-glare layer 150 has the second alignment through hole H21 and the second alignment mark M21 surrounding the second alignment through hole H21. The second alignment mark M21 of the anti-glare layer 150 is aligned with the first alignment mark M11 of the light guide plate 130 to make the second alignment through hole H21 align with the first alignment through hole H1. In some embodiments, the manufacturing method further includes adhering the light guide plate 130 to the anti-glare layer 150 by the second adhesive layer 140, wherein the second adhesive layer 140 has a through hole h2 aligned with the first alignment through hole H1 and the second alignment through hole H21.

Figure 2C:
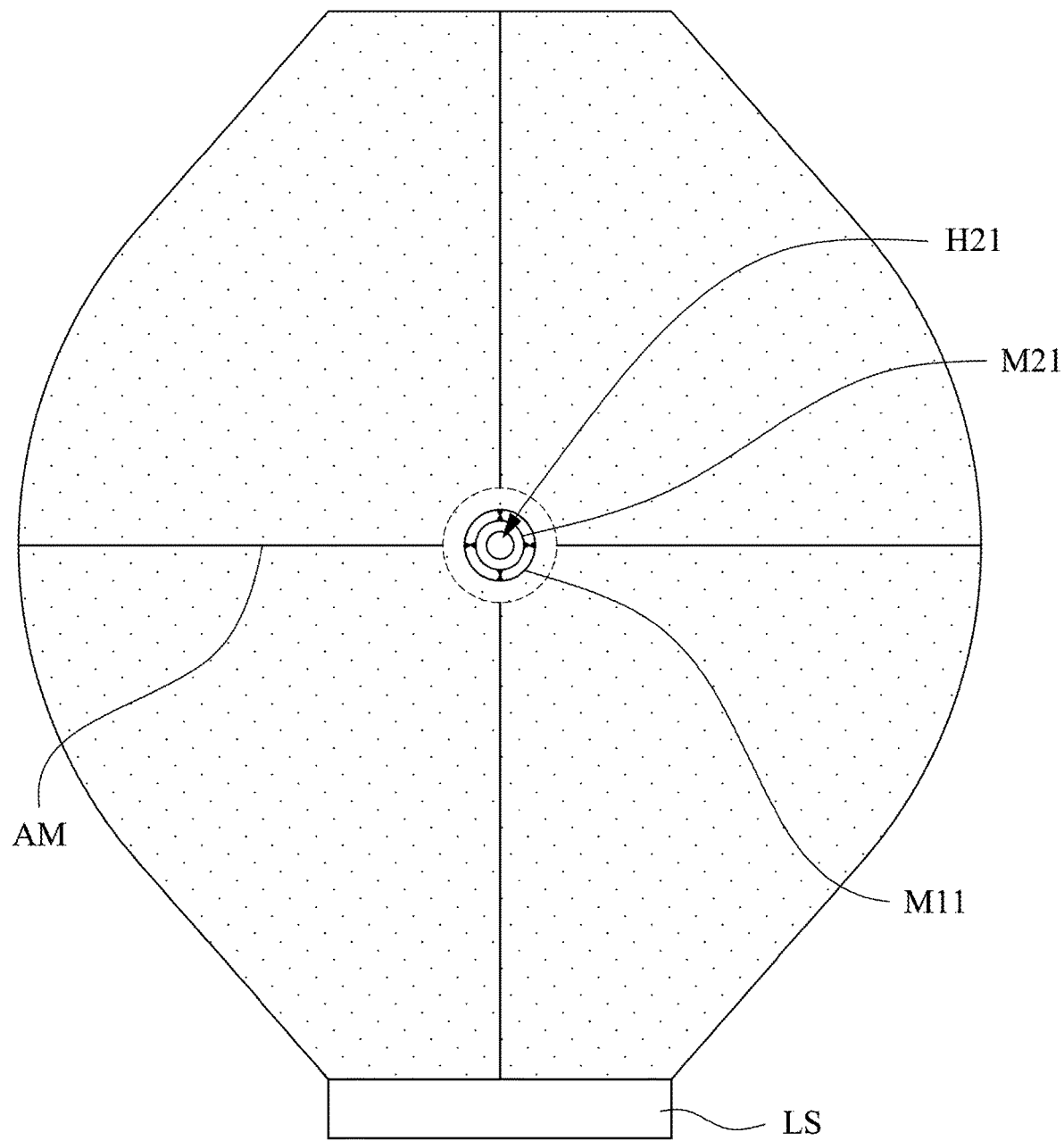

FIG. 2C shows a top view of the display device 200 shown in FIG. 2A. Please refer to FIGS. 2B and 2C simultaneously. By aligning the second alignment mark M21 with the first alignment mark M11, namely aligning the arrowheads of the second alignment mark M21 with the arrowheads of the first alignment mark M11, the second alignment through hole H21 of the anti-glare layer 150 can be aligned with the first alignment through hole H1 of the light guide plate 130. Moreover, the above alignment operations can enhance the alignment accuracy of the second alignment through hole H21 of the anti-glare layer 150 and the first alignment through hole H1 of the light guide plate 130.

Figure 3A:
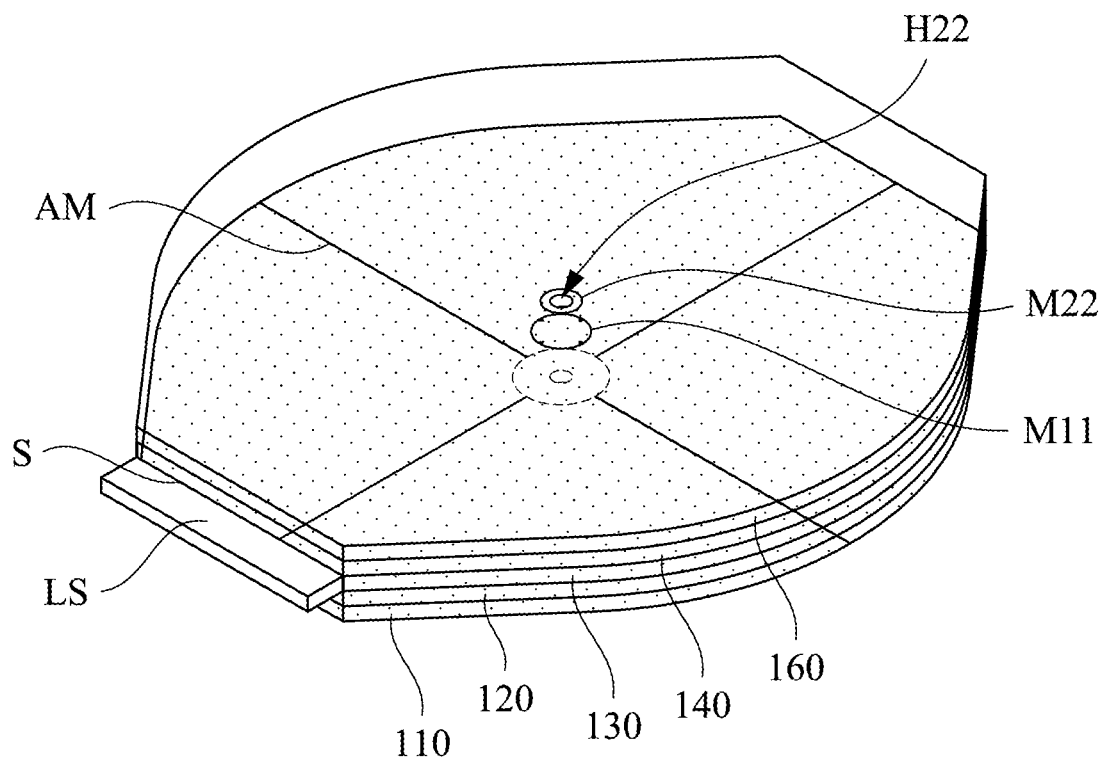

FIG. 3A shows a three dimensional view of a display device 300 according to some embodiments of the present disclosure. As shown in FIG. 3A, the display device 300 includes the display module 110, the first adhesive layer 120, a first optical film such as the light guide plate 130, the light source LS, a second adhesive layer 140, and a second optical film such as a touch sensing layer 160. The touch sensing layer 160 is located on the light guide plate 130. The second adhesive layer 140 is located between the touch sensing layer 160 and the light guide plate 130 to adhere the touch sensing layer 160 to the light guide plate 130. The difference between the display device 300 and the display device 100 is that the display device 300 further includes the second adhesive layer 140 and the touch sensing layer 160.

Figure 3B:
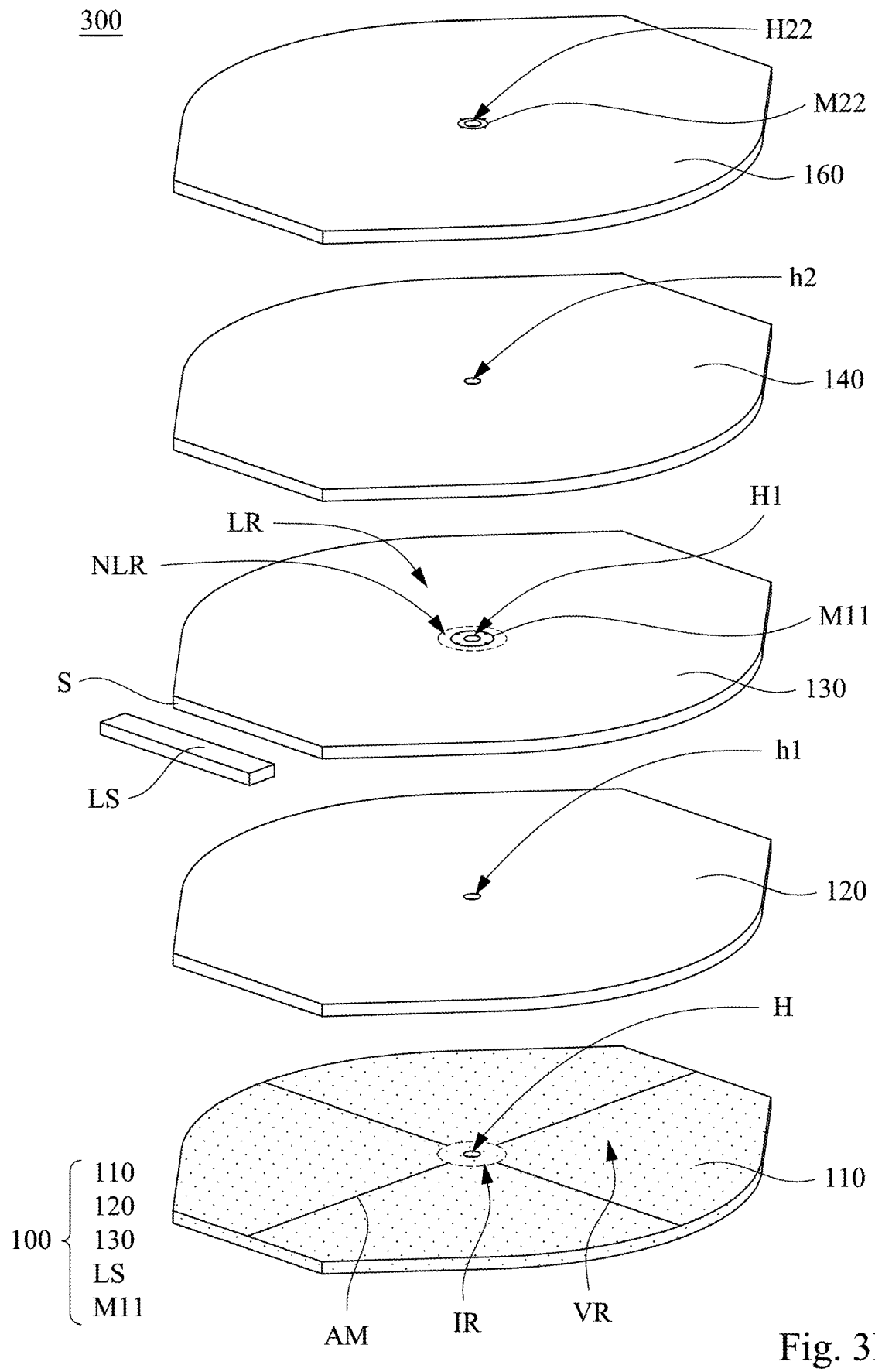

FIG. 3B shows an exploded view of the display device 300 shown in FIG. 3A. As shown in FIG. 3B, the touch sensing layer 160 has a second alignment through hole H22 and a second alignment mark M22 surrounding the second alignment through hole H22, wherein the second alignment through hole H22 of the touch sensing layer 160 is aligned with the first alignment through hole H1 of the light guide plate 130.

In some embodiments, the second alignment mark M22 is an ink pattern or an etching pattern. As shown in FIG. 3B, the second alignment mark M22 is a ring mark having four arrowheads pointing away from the second alignment through hole H22, but the shape of the second alignment through hole H22 is not limited thereto. In another embodiment, the second alignment mark M22 is a mark having four arrowheads pointing away from the second alignment through hole H22.

The manufacturing method of the above display device 300 may include the following operations. The display device 100 is received. The touch sensing layer 160 is disposed on the light guide plate 130, wherein the touch sensing layer 160 has the second alignment through hole H22 and the second alignment mark M22 surrounding the second alignment through hole H22. The second alignment mark M22 of the touch sensing layer 160 is aligned with the first alignment mark M11 of the light guide plate 130 to make the second alignment through hole H22 align with the first alignment through hole H1. In some embodiments, the manufacturing method further includes adhering the light guide plate 130 to the touch sensing layer 160 by the second adhesive layer 140, wherein the second adhesive layer 140 has a through hole h2 aligned with the first alignment through hole H1 and the second alignment through hole H22.

Figure 3C:
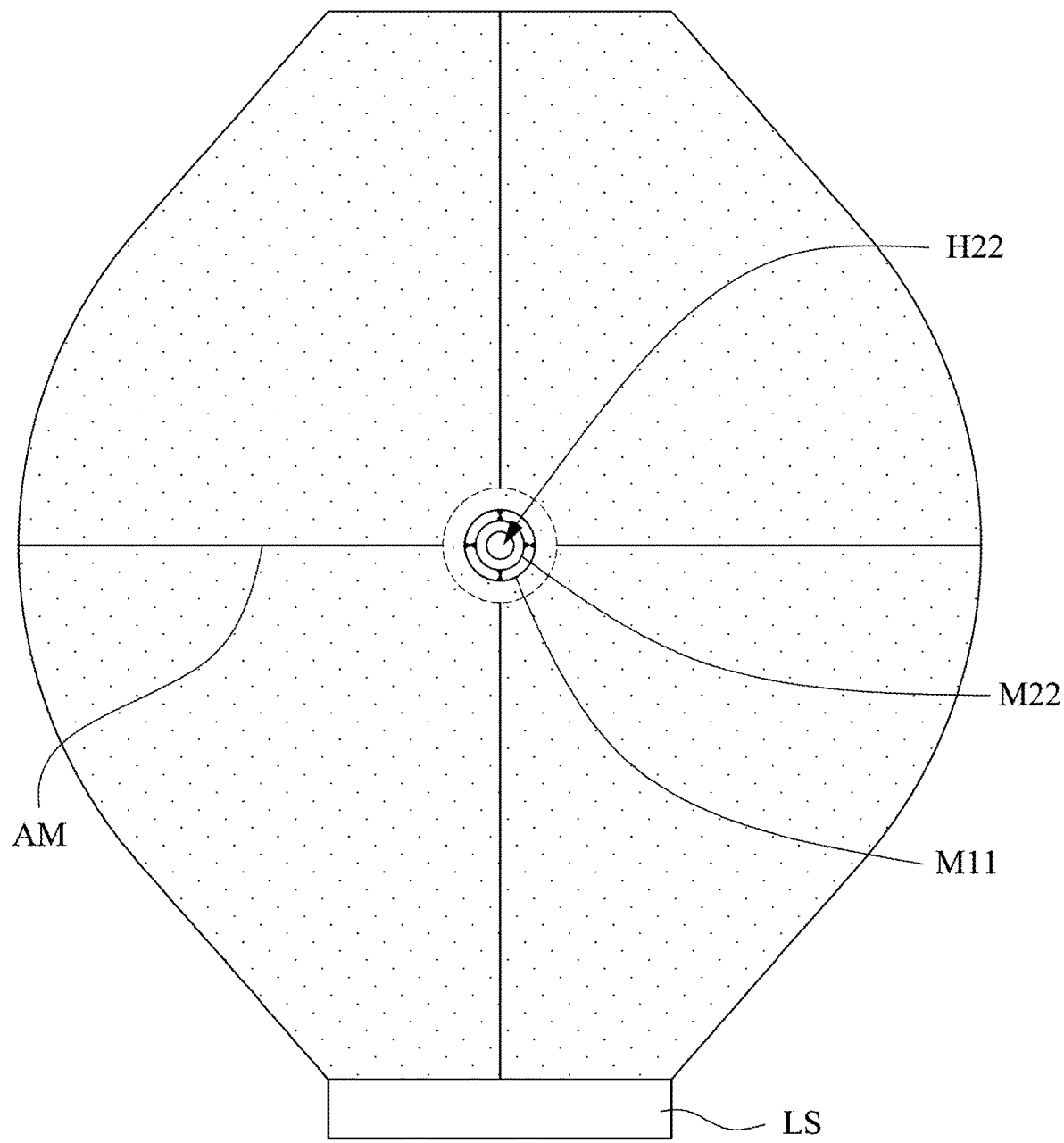

FIG. 3C shows a top view of the display device 300 shown in FIG. 3A. Please refer to FIGS. 3B and 3C simultaneously. By aligning the second alignment mark M22 with the first alignment mark M11, namely aligning the arrowheads of the second alignment mark M22 with the arrowheads of the first alignment mark M11, the second alignment through hole H22 of the touch sensing layer 160 can be aligned with the first alignment through hole H1 of the light guide plate 130. Moreover, the above alignment operations can enhance the alignment accuracy of the second alignment through hole H22 of the touch sensing layer 160 and the first alignment through hole H1 of the light guide plate 130.

Figure 4A:
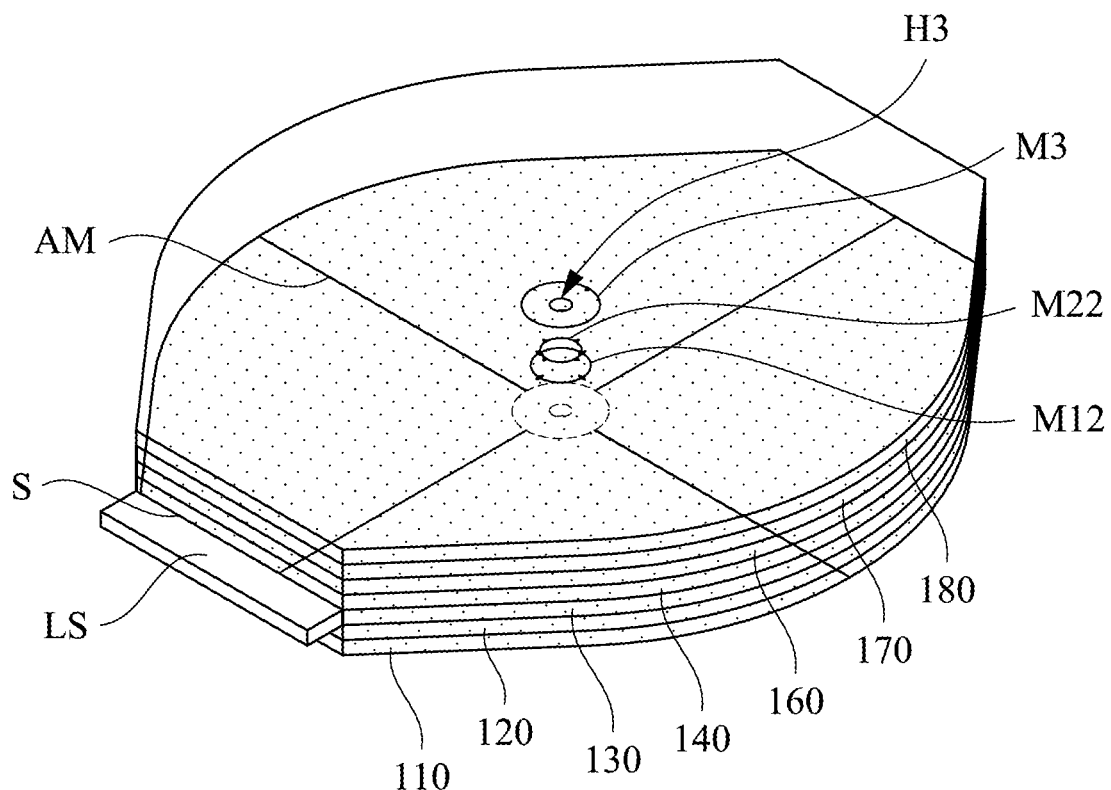

FIG. 4A shows a three dimensional view of a display device 400 according to some embodiments of the present disclosure. As shown in FIG. 4A, the display device 400 includes the display module 110, the first adhesive layer 120, a first optical film such as the light guide plate 130, the light source LS, a second adhesive layer 140, a second optical film such as a touch sensing layer 160, a third adhesive layer 170, and a third optical film such as an anti-glare layer 180. The anti-glare layer 180 is located on the touch sensing layer 160. The third adhesive layer 170 is located between the anti-glare layer 180 and the touch sensing layer 160. The difference between the display device 400 and the display device 300 is that the shape of the first alignment mark M11 of the display device 300 is different from that of the first alignment mark M12 of the display device 400, and the display device 400 further includes the third adhesive layer 170 and the anti-glare layer 180.

Figure 4B:
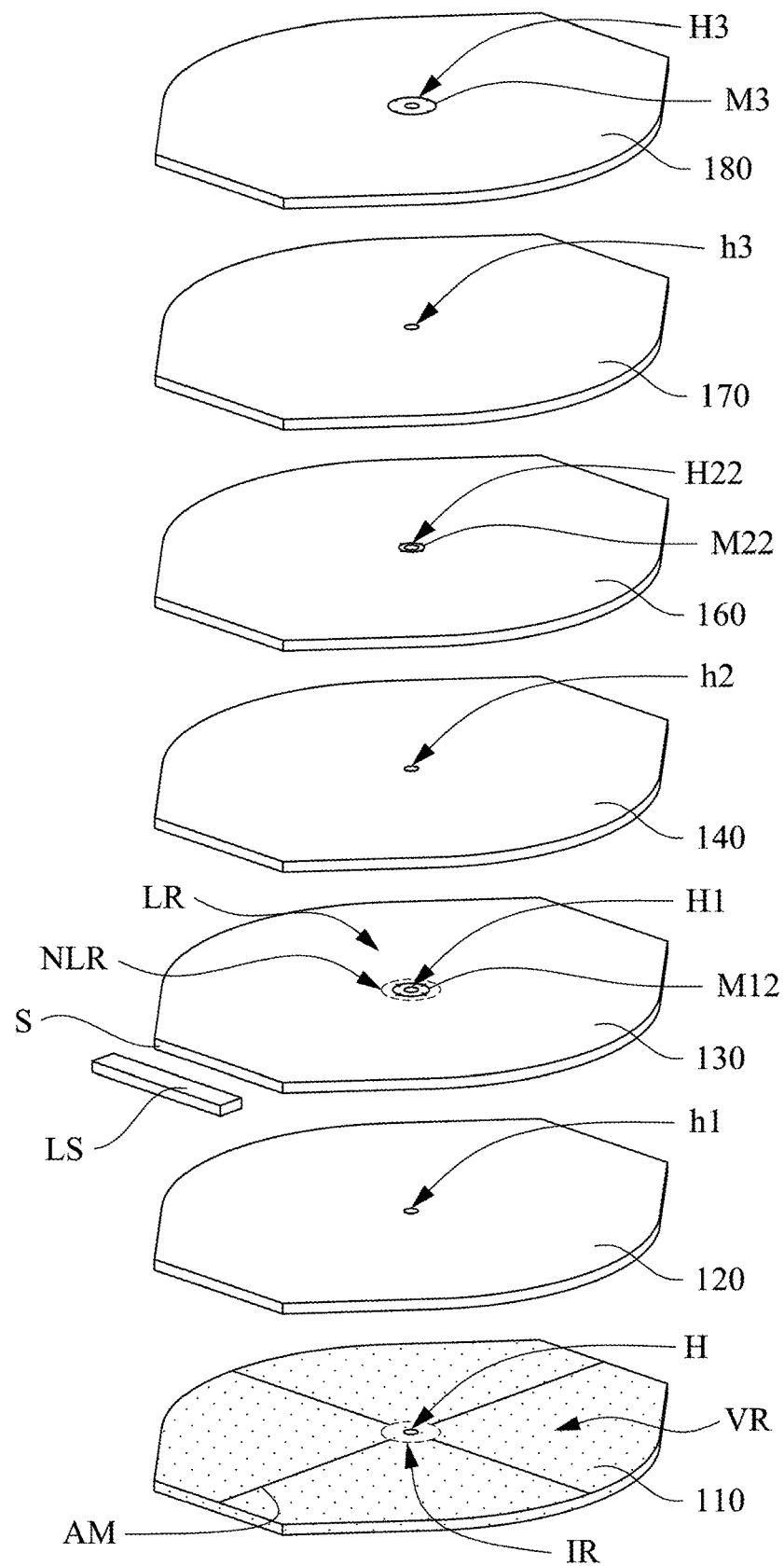

FIG. 4B shows an exploded view of the display device 400 shown in FIG. 4A. As shown in FIG. 4B, the light guide plate 130 has a first alignment through hole H1 aligned with the through hole H and a first alignment mark M12 surrounding the first alignment through hole H1. In some embodiments, the first alignment mark M12 is an ink pattern or an etching pattern. As shown in FIG. 4B, the first alignment mark M12 is a ring mark having four diamond patterns, and each diamond pattern has one end pointing to the first alignment through hole H1, but the shape of the first alignment mark M12 is not limited thereto. In another embodiment, the first alignment mark M12 is a mark consisting of four diamond patterns, wherein each diamond pattern has one end pointing to the first alignment through hole H1.

Please continue to refer FIG. 4B. The anti-glare layer 180 has a third alignment through hole H3 and a third alignment mark M3 surrounding the third alignment through hole H3, wherein the third alignment through hole H3 of the anti-glare layer 180 is aligned with the second alignment through hole H22 of the touch sensing layer 160. In some embodiments, the third alignment mark M3 is an ink pattern or an etching pattern. The third alignment mark M3 is a ring mark having four arrowheads pointing to the third alignment through hole H3. But the shape of the third alignment mark M3 is not limited thereto. In another embodiment, the third alignment mark M3 is a mark having four arrowheads pointing to the first alignment through hole H1.

The manufacturing method of the above display device 400 may include the following operations. A display module is received. The through hole H is formed in the display module 110. The auxiliary alignment mark AM is shown around the through hole H. The light guide plate 130 is disposed on the display module 110. The light guide plate 130 has the first alignment through hole H1 and the first alignment mark M12 surrounding the first alignment through hole H1. The first alignment mark M12 of the light guide plate 130 is aligned with the auxiliary alignment mark AM of the display module 110 to make the first alignment through hole H1 of the light guide plate 130 align with the through hole H of the display module 110. The touch sensing layer 160 is disposed on the light guide plate 130, wherein the touch sensing layer 160 has the second alignment through hole H22 and the second alignment mark M22 surrounding the second alignment through hole H22. The second alignment mark M22 of the touch sensing layer 160 is aligned with the first alignment mark M12 of the light guide plate 130 to make the second alignment through hole H22 align with the first alignment through hole H1. The anti-glare layer 180 is disposed on the touch sensing layer 160, wherein the anti-glare layer 180 has the third alignment through hole H3 and the third alignment mark M3 surrounding the third alignment through hole H3. The third alignment mark M3 is aligned with the second alignment mark M22 to make the third alignment through hole H3 align with the second alignment through hole H22.

In some embodiments, the manufacturing method further includes disposing the light source LS next to the side S of the light guide plate 130. In some embodiments, the manufacturing method further includes adhering the display module 110 to the light guide plate 130 by the first adhesive layer 120, wherein the first adhesive layer 120 has the through hole h1 aligned with the first alignment through hole H1 and the through hole H. In some embodiments, the manufacturing method further includes adhering the light guide plate 130 to the touch sensing layer 160 by the second adhesive layer 140, wherein the second adhesive layer 140 has the through hole h2 aligned with the first alignment through hole H1 and the second alignment through hole H22. In some embodiments, the manufacturing method further includes adhering the touch sensing layer 160 to the anti-glare layer 180 by the third adhesive layer 170, wherein the third adhesive layer 170 has a through hole h3 aligned with the second alignment through hole H22 and the third alignment through hole H3.

Figure 4C:
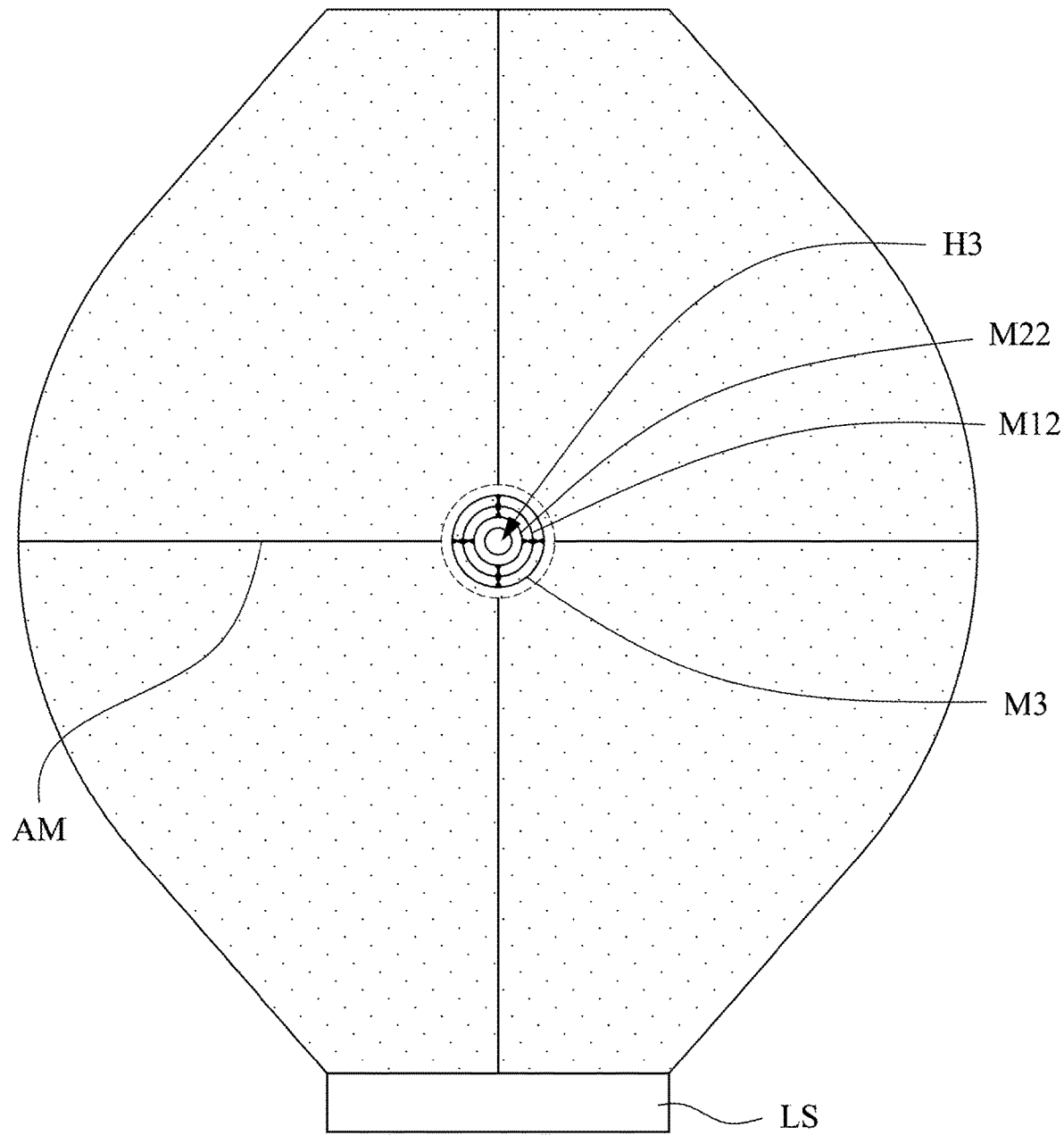

FIG. 4C shows a top view of the display device 400 shown in FIG. 4A. Please refer to FIGS. 4B and 4C simultaneously. By aligning the second alignment mark M22 with the first alignment mark M12, namely aligning the arrowheads of the second alignment mark M22 with the diamond patterns of the first alignment mark M12, the second alignment through hole H22 of the touch sensing layer 160 can be aligned with the first alignment through hole H1 of the light guide plate 130. By aligning the third alignment mark M3 with the first alignment mark M12, namely aligning the arrowheads of the third alignment mark M3 with the diamond patterns of the first alignment mark M12, the third alignment through hole H3 of the anti-glare layer 180 can be aligned with the first alignment through hole H1 of the light guide plate 130. The above alignment operations can enhance the alignment accuracy of the second alignment through hole H22 of the touch sensing layer 160 and the first alignment through hole H1 of the light guide plate 130, and also enhance the alignment accuracy of the third alignment through hole H3 of the anti-glare layer 180 and the first alignment through hole H1 of the light guide plate 130.

Further, in another embodiment of the present disclosure, the display module 110 further includes a light emitting display layer. For example, the light emitting display layer is OLED. For example, when OLED is located under the EPD and used as a light emitting display layer, the light guide plate 130 and its side light source LS can be omitted, and the touch sensing layer or the anti-glare layer can be directly adhered on the upper surface of the display module 110.

In view of the foregoing, by disposing alignment marks on an optical film such as a light guide plate, a touch sensing layer, and anti-glare layer, the alignment accuracy of the through holes of the optical film and display module can be enhanced. Moreover, the alignment between the through holes is not influenced by the shape difference between the display module and the optical film. Therefore, the above manufacturing method of the present disclosure can be particularly applied on manufacturing a non-square display device.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display device, comprising:
 a display module having a through hole and comprising a non-visual region surrounding the through hole, and a visual region surrounding the non-visual region;
 a plurality of auxiliary marks shown on the display module, wherein each of the auxiliary marks is shown as a line which extends from an outer boundary of the non-visual region, traverses the visual region, and ends at an outer boundary of the display module; and
 a first optical film located on the display module, wherein the first optical film has a first alignment through hole aligned with the through hole and a first alignment mark surrounding the first alignment through hole, the first alignment mark comprises a circular pattern and a plurality of pointing marks substantially disposed around the circular pattern, the pointing marks point to the first alignment through hole, and the pointing marks are aligned respectively with the auxiliary marks of the display module.

2. The display device of claim 1, further comprising a light source disposed next to a side of the first optical film, wherein the first optical film is a light guide plate.

3. The display device of claim 1, further comprising a second optical film on the first optical film, wherein the second optical film has a second alignment through hole aligned with the first alignment through hole and a second alignment mark surrounding the second alignment through hole, and the first alignment mark is aligned with the second alignment mark.

4. The display device of claim 3, wherein the first optical film is a light guide plate, and the second optical film is an anti-glare layer or a touch sensing layer.

5. The display device of claim 3, further comprising a third optical film on the second optical film, wherein the third optical film has a third alignment through hole aligned with the second alignment through hole and a third alignment mark surrounding the third alignment through hole, the second alignment mark is aligned with the third alignment mark, the first optical film is a light guide plate, the second optical film is a touch sensing layer, and the third optical film is an anti-glare layer.

6. The display device of claim 1, wherein the display module further comprises a light emitting display layer.

7. The display device of claim 1, wherein the non-visual region is substantially circular.

8. The display device of claim 1, wherein the auxiliary marks are symmetrically arranged around the non-visual region of the display module, and the pointing marks are symmetrically arranged around the circular pattern of the first optical film.

9. A manufacturing method of a display device, comprising:
- providing a display module which has a through hole thereon and comprises a non-visual region surrounding the through hole, and a visual region surrounding the non-visual region;
- marking a plurality of auxiliary marks on the display module, wherein each of the auxiliary marks is shown as a line which extends from an outer boundary of the non-visual region, traverses the visual region, and ends at an outer boundary of the display module;
- disposing a first optical film on the display module, wherein the first optical film has a first alignment through hole and a first alignment mark surrounding the first alignment through hole, the first alignment mark comprises a circular pattern and a plurality of pointing marks substantially disposed around the circular pattern, and the pointing marks point to the first alignment through hole; and
- aligning the first alignment mark with the auxiliary marks to make the first alignment through hole align with the through hole, wherein the pointing marks of the first alignment mark of the first optical film are aligned respectively with the auxiliary marks of the display module.

10. The manufacturing method of claim 9, further comprising:
- disposing a second optical film on the first optical film, wherein the second optical film has a second alignment through hole and a second alignment mark surrounding the second alignment through hole; and
- aligning the second alignment mark with the first alignment mark to make the second alignment through hole align with the first alignment through hole.

11. The manufacturing method of claim 10, further comprising:
- disposing a third optical film on the second optical film, wherein the third optical film has a third alignment through hole and a third alignment mark surrounding the third alignment through hole; and
- aligning the third alignment mark with the second alignment mark to make the third alignment through hole align with the second alignment through hole.

12. The manufacturing method of claim 9, further comprising disposing a light source next to a side of the first optical film.

13. The manufacturing method of claim 9, wherein the through hole is formed by a laser cutting.

14. The manufacturing method of claim 9, further comprising removing the auxiliary marks.

15. The display device of claim 8, wherein there are four of the auxiliary marks and four of the pointing marks.

* * * * *